(12) United States Patent
Shao et al.

(10) Patent No.: US 12,408,326 B2
(45) Date of Patent: Sep. 2, 2025

(54) SEMICONDUCTOR STRUCTURE AND FORMATION METHOD THEREOF, AND MEMORY

(71) Applicant: CHANGXIN MEMORY TECHNOLOGIES, INC., Hefei (CN)

(72) Inventors: Guangsu Shao, Hefei (CN); Deyuan Xiao, Hefei (CN); Yunsong Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 516 days.

(21) Appl. No.: 17/899,627

(22) Filed: Aug. 31, 2022

(65) Prior Publication Data

US 2023/0413535 A1 Dec. 21, 2023

Related U.S. Application Data

(63) Continuation of application No. PCT/CN2022/103375, filed on Jul. 1, 2022.

(30) Foreign Application Priority Data

Jun. 21, 2022 (CN) ........................ 202210709072.8

(51) Int. Cl.
H10B 12/00 (2023.01)
(52) U.S. Cl.
CPC .......... *H10B 12/482* (2023.02); *H10B 12/05* (2023.02)

(58) Field of Classification Search
CPC ..... H10B 12/482; H10B 12/488; H10B 12/05
See application file for complete search history.

(56) References Cited

U.S. PATENT DOCUMENTS

| 2019/0198505 | A1* | 6/2019 | Liao ............... | H10B 12/488 |
| 2021/0366911 | A1 | 11/2021 | Yen | |
| 2023/0301069 | A1* | 9/2023 | Li ................ | H10B 12/34 |
| | | | | 257/296 |
| 2023/0320079 | A1* | 10/2023 | Shao ............... | H10B 12/488 |
| | | | | 438/424 |
| 2023/0380131 | A1* | 11/2023 | Shao ............... | H10B 12/488 |

* cited by examiner

*Primary Examiner* — Richard A Booth
(74) *Attorney, Agent, or Firm* — Kilpatrick Townsend & Stockton LLP

(57) ABSTRACT

Embodiments relate to a semiconductor structure and a formation method. The method includes: providing a base substrate, where the base substrate includes a substrate and an insulating material layer, the substrate includes a plurality of first trenches arranged at intervals along a first direction, and the insulating material layer fills each of the plurality of first trenches; etching the base substrate to form a plurality of second trenches arranged at intervals along a second direction, the second direction intersecting the first direction; removing a part of a material of the substrate below the plurality of second trenches to form third trenches below the plurality of second trenches, the third trenches penetrating through each of the plurality of second trenches; filling a conductive material into the third trenches to form bit line structures; and forming word line structures in the plurality of second trenches.

16 Claims, 9 Drawing Sheets

SEMICONDUCTOR STRUCTURE AND FORMATION METHOD THEREOF, AND MEMORY

CROSS-REFERENCE TO RELATED APPLICATION

The present disclosure is a continuation of PCT/CN2022/103375, filed on Jul. 1, 2022, which claims priority to Chinese Patent Application No. 202210709072.8, titled "SEMICONDUCTOR STRUCTURE AND FORMATION METHOD THEREOF, AND MEMORY" and filed on Jun. 21, 2022, the entire contents of which are incorporated herein by reference.

TECHNICAL FIELD

The present disclosure relates to the field of semiconductor technology, and more particularly, to a semiconductor structure and a formation method thereof, and a memory.

BACKGROUND

Dynamic Random Access Memory (DRAM) is widely used in mobile devices such as mobile phones and tablet computers due to its advantages of small size, high integration and fast transmission speed, etc. A word line structure and a bit line structure are core components of the DRAM. However, existing processes for fabricating the word line structure and the bit line structure are more complicated, and have higher fabrication costs.

It is to be noted that the information disclosed in the above background art section is only for enhancement of understanding of the background of the present disclosure, and therefore may include information that does not constitute the prior art that is already known to a person of ordinary skill in the art.

SUMMARY

In view of this, the present disclosure provides a semiconductor structure and a formation method thereof, and a memory, which may improve alignment accuracy of third trenches, simplify fabrication processes, and reduce fabrication costs.

According to one aspect of the present disclosure, there is provided a semiconductor structure, which is formed by means of a method for forming a semiconductor structure, and the method includes:
  providing a base substrate, the base substrate comprising a substrate and an insulating material layer, the substrate comprising a plurality of first trenches arranged at intervals along a first direction, and the insulating material layer filling each of the plurality of first trenches;
  etching the base substrate to form a plurality of second trenches arranged at intervals along a second direction, the second direction intersecting with the first direction;
  removing a part of a material of the substrate below the plurality of second trenches to form third trenches below the plurality of second trenches, the third trenches penetrating through each of the plurality of second trenches;
  filling a conductive material into the third trenches to form bit line structures; and
  forming word line structures in the plurality of second trenches, the word line structures being insulated from the bit line structures.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Exemplary embodiments will now be described more comprehensively with reference to the accompanying drawings. However, the exemplary embodiments may be carried out in various manners, and shall not be interpreted as being limited to the embodiments set forth herein; instead, providing these embodiments will make the present disclosure more comprehensive and complete, and will fully convey the conception of the exemplary embodiments to those skilled in the art. Throughout the drawings, similar reference signs indicate the same or similar structures, and thus their detailed description will be omitted. In addition, the accompanying drawings are merely exemplary illustration of the present disclosure, and are not necessarily drawn to scale.

Although this specification employs relativity terms such as "above" and "below" to describe a relative relation between one component and another component of icons, these terms are merely for convenience of this specification, for example, the directions of the examples in the accompanying drawings. It is to be understood that when the apparatus of the icon are turned upside down, components described as "above" will become components described as "below". When a certain structure is "above" other structures, it likely means that the certain structure is integrally formed on the other structures, or the certain structure is "directly" arranged on the other structures, or the certain structure is "indirectly" arranged on the other structures by means of another structure.

The terms "one", "a", "said", "the" and "at least one" may be intended to indicate presence of one or more elements/constituent parts, etc. The terms "comprising" and "having" are inclusive and therefore specify the presence of other elements/constituent parts or the like in addition to the elements/constituent parts listed out. The terms "first", "second" and "third" or the like are merely for marker purposes, and do not impose numerical limitations on objects thereof.

Figure 1:
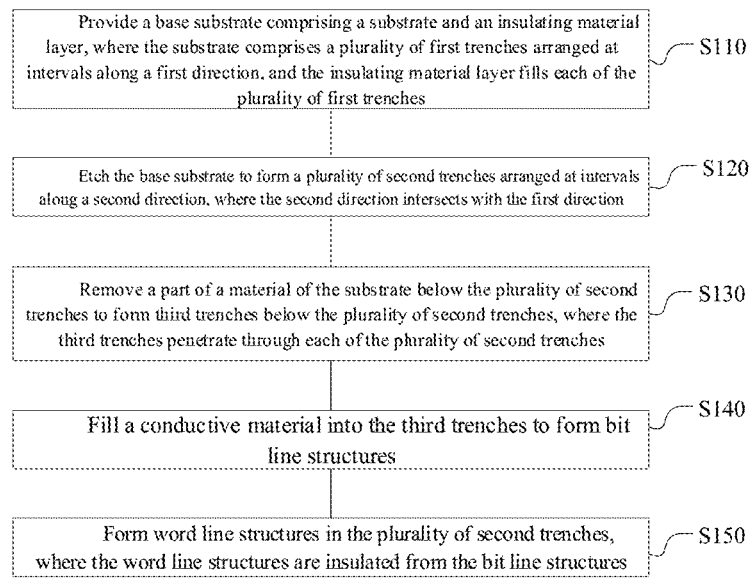
FIG. 1 is a flowchart of a method for forming a semiconductor structure according to an embodiment of the present disclosure.
Figure 2:
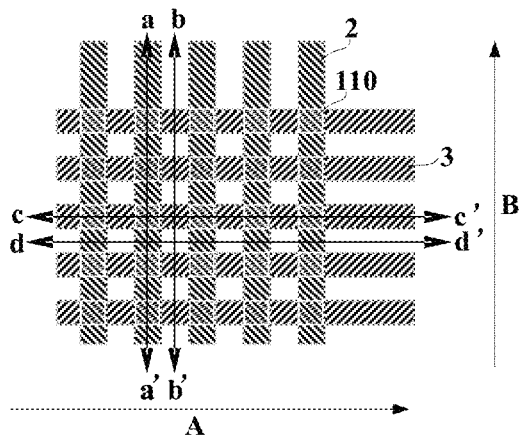
FIG. 2 is a vertical view of a semiconductor structure according to an embodiment of the present disclosure.
Figure 3:
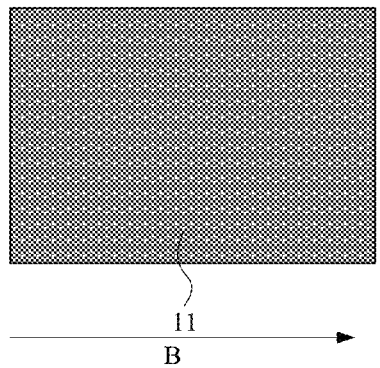
FIG. 3 is a schematic diagram of a substrate cut along an aa' direction in FIG. 2 according to an embodiment of the present disclosure.
Figure 4:
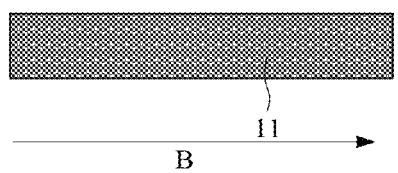
FIG. 4 is a schematic diagram of a substrate cut along a bb' direction in FIG. 2 according to an embodiment of the present disclosure.

The present disclosure provides a method for forming a semiconductor test structure. FIG. 1 shows a flowchart of the method for forming a semiconductor test structure according to an embodiment of the present disclosure. Referring to FIG. 1, the formation method may include Steps S110 to S150 as below.

Step S110, providing a base substrate comprising a substrate and an insulating material layer, where the substrate comprises a plurality of first trenches arranged at intervals along a first direction, and the insulating material layer fills each of the plurality of first trenches;

Step S120, etching the base substrate to form a plurality of second trenches arranged at intervals along a second direction, where the second direction intersects with the first direction;

Step S130, removing a part of a material of the substrate below the plurality of second trenches to form third trenches below the plurality of second trenches, where the third trenches penetrate through each of the plurality of second trenches;

Step S140, filling a conductive material into the third trenches to form bit line structures; and Step S150, forming word line structures in the plurality of second trenches, where the word line structures are insulated from the bit line structures.

According to the method for forming a semiconductor structure provided in the present disclosure, the second trenches for forming the word line structures may be formed first, and then third trenches for forming the bit line structures are formed by etching the bottoms of the second trenches. In this process, in one aspect, formation positions of the third trenches may be defined by each of the second trenches, to improve the alignment accuracy of the third trenches. In another aspect, in the process of forming the third trenches, the bottoms of the second trenches may be further etched using a mask layer for forming the second trenches as a mask, thereby forming the third trenches penetrating through each of the second trenches, to avoid separately forming a mask layer for accommodating the trenches of the bit line structures, which may simplify the processes and reduce the fabrication costs. In addition, insulating the word line structures from the bit line structures may avoid occurrence of short circuit or coupling between the word line structures and the bit line structures, thereby improving product yield.

The steps of the method for forming a semiconductor structure according to the embodiments of the present disclosure are described in detail below.

As shown in FIG. 1, in Step S110, a substrate is provided, the base substrate comprises a substrate and an insulating material layer, the substrate comprises a plurality of first trenches arranged at intervals along a first direction, and the insulating material layer fills each of the plurality of first trenches.

In an exemplary embodiment of the present disclosure, as shown in FIG. 2 to FIG. 5, a base substrate 1 may include a substrate 11 and an insulating material layer 12, a plurality of first trenches 101 arranged at intervals along a first direction A may be provided in the substrate 11, and each of the first trenches 101 may extend along a second direction B. The first trenches 101 may be of trench-shaped structures formed by inwards recessing a surface of the substrate 11, and may penetrate through two ends of the substrate 11.

The first direction A may intersect the second direction B, for example, the first direction A and the second direction B may be perpendicular to each other. It is to be noted that the perpendicular may be absolutely perpendicular or approximately perpendicular, because deviations are unavoidable in manufacturing processes. In the present disclosure, deviation of an angle may be caused by limitations on fabrication technologies, such that there is a certain deviation of an angle between the first direction A and the second direction B. However, it may be considered that the first direction A is perpendicular to the second direction B as long as the deviation of the angle between the first direction A and the second direction B is within a preset range. For example, the preset range may be 10°. That is, when the angle between the first direction A and the second direction B is within a range of greater than or equal to 80° and less than or equal to 100°, it may be considered that the first direction A is perpendicular to the second direction B.

Figure 6:
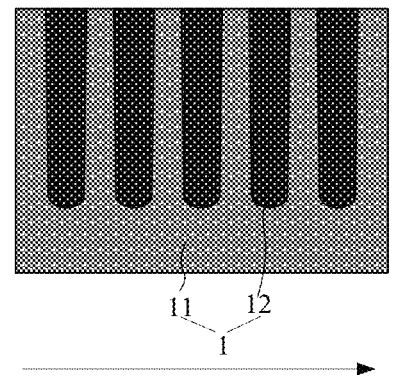
FIG. 6 is a schematic diagram of an insulating material layer according to an embodiment of the present disclosure.

As shown in FIG. 6, an insulating material may be filled into each of the first trenches 101, thereby forming the insulating material layer 12. The insulating material layer 12 may fill up each of the first trenches 101, and an upper surface of the insulating material layer 12 may be flush with that of the substrate 11.

In an exemplary embodiment of the present disclosure, a base substrate 1 is provided, the base substrate 1 comprises a substrate 11 and an insulating material layer 12, the substrate 11 comprises a plurality of first trenches 101 arranged at intervals along the first direction A, and the insulating material layer 12 fills each of the plurality of first trenches 101 (i.e., Step S110). Step S110 may include Steps S210 to S230 as below.

In Step S210, the substrate 11 is provided.

The substrate 11 may have a flat plate structure, which may be rectangular, circular, elliptical, polygonal or irregular, and a material of the substrate 11 may be silicon or other semiconductor materials. The shape and the material of the substrate 11 are not limited here.

In Step S220, the substrate 11 is etched to form a plurality of first trenches 101 distributed at intervals, where the first trenches 101 extend along the second direction B, and the plurality of the first trenches 101 are distributed at intervals along the first direction A.

Figure 5:
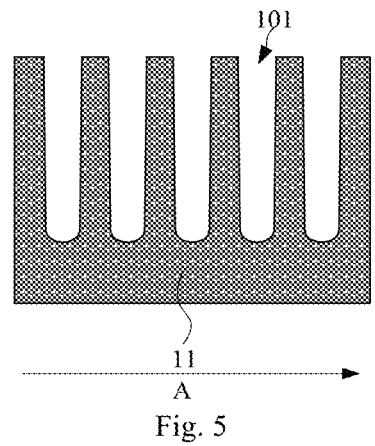
FIG. 5 is a schematic diagram of a substrate cut along a cc' direction or a dd' direction in FIG. 2 according to an embodiment of the present disclosure.

The plurality of first trenches 101 may be form in the substrate 11 by means of a photolithography process, where each of the plurality of first trenches 101 may extend along the second direction B, and the plurality of first trenches 101 may be distributed at intervals along the first direction A. For example, a photoresist layer may be formed on a surface of the substrate 11 by means of spin coating or by other means, where a material of the photoresist layer may be positive photoresist or negative photoresist, which is not limited herein. A shape of the photoresist layer far away from the surface of the substrate 11 may be the same as that of the surface of the substrate 11. The photoresist layer may be exposed by means of a mask, where a pattern of the mask may be matched to a desired pattern of each of the plurality of first trenches 101. Subsequently, the exposed photoresist layer may be developed to form a development region, which can expose the substrate 11. A pattern of the development region may be the same as the desired pattern of each of the plurality of first trenches 101, and a size of the development region may be the same as that desired by each of the plurality of first trenches 101. Anisotropic etching may be performed on the substrate 11 in development regions to form each of the first trenches 101. It should be noted that, in a direction perpendicular to the substrate 11, the first trenches 101 do not penetrate through the substrate 11, that is, a material of the substrate 11 is still retained at the bottoms of the first trenches 101. In the embodiments of the present disclosure, a structure obtained after Step S210 is completed is as shown in FIG. 5.

In Step S230, an insulating material is filled into each of the plurality of first trenches 101 to form an insulating material layer 12.

The insulating material may be filled into each of the plurality of first trenches 101 by means of vacuum evaporation, magnetron sputtering, chemical vapor deposition, physical vapor deposition or atomic layer deposition and so on, and the insulating material may fill up all the plurality of first trenches 101. In one embodiment, the insulating material may be an oxide, for example, silicon oxide. In the embodiments of the present disclosure, a structure obtained after Step S230 is completed is as shown in FIG. 6.

As shown in FIG. 1, in Step S120, the base substrate is etched to form a plurality of second trenches distributed at intervals along a second direction, where the second direction intersects the first direction.

Figure 7:
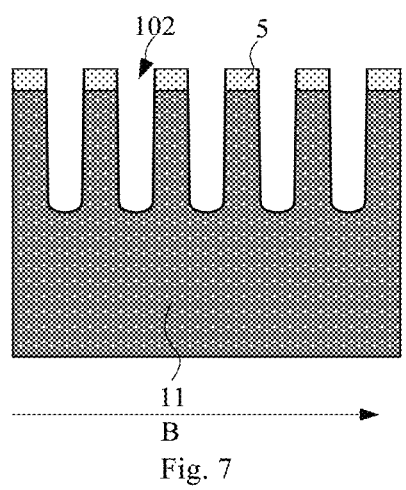
FIG. 7 is a schematic diagram cut along the aa' direction after Step S120 is completed according to an embodiment of the present disclosure.

As shown in FIG. 7, the base substrate 1 may be etched to form, in the base substrate 1, a plurality of second trenches 102 distributed at intervals. Each of the second trenches 102 may extend along the first direction A, and the plurality of second trenches 102 may be distributed at intervals along the second direction B. In some embodiments of the present disclosure, in a direction perpendicular to the substrate 11, the second trench 102 does not penetrate through the substrate 11, that is, the material of the substrate 11 is still retained at the bottom of the second trench 102. For example, in a direction perpendicular to the substrate 11, a depth of the second trench 102 may be smaller than that of the first trench 101.

Figure 8:
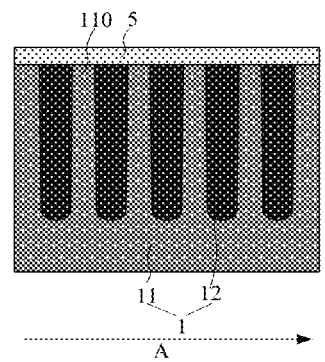
FIG. 8 is a schematic diagram cut along the cc' direction after Step S120 is completed according to an embodiment of the present disclosure.

In an exemplary embodiment of the present disclosure, as shown in FIG. 8, each of the second trenches 102 and each of the first trenches 101 may divide a plurality of groups of support pillars 110 arranged at intervals along the first direction A in the substrate 11. For example, each of the plurality of groups of support pillars 110 may be uniformly spaced apart along the first direction A; and the plurality of groups of support pillars 110 may be spaced apart along the second direction B. For example, each of the plurality of groups of support pillars 110 may be uniformly spaced apart along the second direction B.

In an exemplary embodiment of the present disclosure, the base substrate 1 is etched to form a plurality of second trenches 102 distributed at intervals along the second direction B (i.e., Step S120). Step S120 may include Steps S310 to S350 as below.

Step S310, forming a mask layer 5 on a surface of the base substrate 1.

In the embodiments of the present disclosure, the mask layer 5 may be formed on the surface of the base substrate 1 by means of chemical vapor deposition, physical vapor deposition, vacuum evaporation, magnetron sputtering, atomic layer deposition or the like. The mask layer 5 may be a multilayered film structure or a single-layer film structure. A material of the mask layer 5 may be at least one of polymer, $SiO_2$, SiN, polysilicon and SiCN. Of course, the mask layer 5 may also be made of other materials, which are not be enumerated one by one here.

In some embodiments, the mask layer 5 may be a multilayered, and may include a polymer layer, an oxide layer 63 and a hard mask layer 5, where the polymer layer may be formed on the surface of the base substrate 1, and the oxide layer 63 may be positioned between the hard mask layer 5 and the polymer layer. The polymer layer may be formed on the surface of the base substrate 1 by means of chemical vapor deposition, the oxide layer 63 may be formed on a surface of the polymer layer by means of vacuum evaporation, and the hard mask layer 5 may be formed on a surface of the oxide layer 63 by means of atomic layer deposition.

Step S320, forming a photoresist layer on a surface of the mask layer 5.

A photoresist layer may be formed on the surface of the mask layer 5 facing away from the base substrate 1 by means of spin coating or by other means, where a material of the photoresist layer may be positive photoresist or negative photoresist, which is not limited herein.

Step S330, exposing and developing the photoresist layer to form a plurality of development regions arranged at intervals.

The photoresist layer may be exposed by means of a mask, where a pattern of the mask may be matched to a desired pattern of the second trenches 102. Subsequently, an exposed photoresist layer may be developed to form a plurality of development regions arranged at intervals, each of the development regions may expose the surface of the mask layer 5, patterns of the development regions may be the same as patterns needed by the second trenches 102, and sizes of the development regions may be the same as sizes needed by the second trenches 102.

Step S340, etching the mask layer 5 in the plurality of development regions to form a plurality of mask patterns arranged at intervals along the second direction B, where orthographic projections of the plurality of mask patterns on the substrate 11 traverse the plurality of first trenches 101.

The mask layer 5 may be etched in each of the development regions by means of an anisotropic etching process, and etching regions may expose the base substrate 1, thereby forming the plurality of mask patterns on the mask layer 5. The mask patterns may be strip-shaped and may intersect with extension directions of the first trenches 101, and an orthographic projection of each of the mask patterns on the base substrate 1 may traverse the plurality of first trenches 101 respectively. For example, the mask patterns may be strip-shaped patterns extending along the first direction A, and the plurality of mask patterns may be arranged at intervals along the second direction B.

It should be noted that, when the mask layer 5 is of a single-layer structure, the mask patterns may be formed by means of once etching process. When the mask layer 5 is of a multi-layered structure, each film layer may be etched in layers. That is, in the once etching process, one layer may be etched, and multiple etching processes may be employed to etch through the mask layer 5 to form the mask patterns. In one embodiment, the shapes and sizes of the mask patterns may be the same as the patterns and sizes needed by the second trenches 102.

It should be noted that, after the above etching process is completed, the photoresist layer may be removed by cleaning with a cleaning solution or by means of ashing and other processes, such that the etched mask layer 5 is no longer covered by the photoresist layer.

Step S350, performing anisotropic etching on the base substrate 1 using the mask layer 5 having the plurality of mask patterns as a mask, to form a plurality of second trenches 102 extending along the first direction A and arranged at intervals along the second direction B.

Still referring to FIG. 7, the mask layer 5 having the mask patterns may be used as the mask to perform the anisotropic etching on the base substrate 1, to form a plurality of second trenches 102 extending along the first direction A and arranged at intervals along the second direction B. In some embodiments of the present disclosure, the second trenches 102 are perpendicular to the first trenches 101. Still referring to FIG. 8, the first trenches 101 and the second trenches 102 may divide the substrate 11 into a plurality of support pillars 110 arranged in an array, and the support pillars 110 may be arranged in a form of rows and columns. After each of the second trenches 102 is formed, there is no need to remove the mask layer 5 for use in the process of subsequently etching to form the third trenches 103, which may avoid forming the mask layer 5 for accommodating the trenches of the bit line structures 2 separately, the process may be simplified, and the fabrication costs may be reduced.

As shown in FIG. 1, in Step S130, a part of the material of the substrate below the plurality of second trenches is removed to form third trenches below the plurality of second trenches, where the third trenches penetrate through each of the plurality of second trenches.

Figure 9:
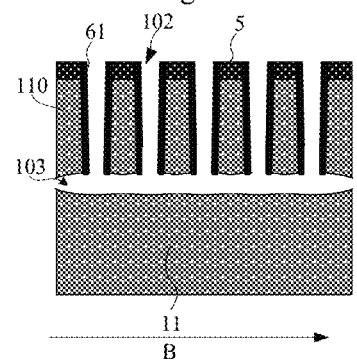
FIG. 9 is a schematic diagram cut along the aa' direction after Step S320 is completed according to an embodiment of the present disclosure.
Figure 10:
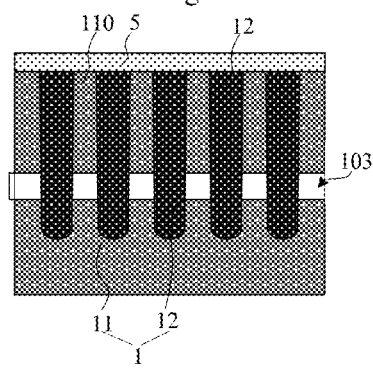
FIG. 10 is a schematic diagram cut along the cc' direction after Step S130 is completed according to an embodiment of the present disclosure.

As shown in FIG. 9 and FIG. 10, the third trenches 103 may be formed by means of the second trenches 102. During this process, the formation positions of the third trenches 103 may be defined by each of the second trenches 102 to improve the alignment accuracy of the third trenches 103. The third trenches 103 may be positioned at the bottoms of the second trenches 102 and communicated with the bottoms of the second trenches 102. In some embodiments of the present disclosure, the third trenches 103 may penetrate through the bottoms of the plurality of second trenches 102. There may be a plurality of third trenches 103, each of the third trenches 103 may extend along the second direction B, and the plurality of third trenches 103 may be arranged at intervals along the first direction A.

In an exemplary embodiment of the present disclosure, part of the material of the substrate 11 positioned below the second trenches 102 is removed to form third trenches 103 below the second trenches 102, and the third trenches 103 penetrate through each of the second trenches 102 (i.e., Step S130). Step S130 may include Step S410 and Step S420 as below.

Step S410, forming first spacers 61 conformally attached to side walls of the plurality of second trenches 102, and exposing the substrate 11 positioned at bottoms of the plurality of second trenches 102.

Figure 11:
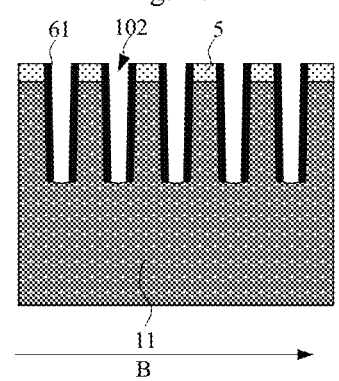
FIG. 11 is a schematic diagram cut along the aa' direction after Step S410 is completed according to an embodiment of the present disclosure.

As shown in FIG. 11, the first spacers 61 conformally attached to the side walls of the plurality of second trenches 102 may be formed on the side walls of the plurality of second trenches 102 by means of vacuum evaporation, magnetron sputtering, chemical vapor deposition, physical vapor deposition, or atomic layer deposition, etc. The first spacers 61 may be configured to protect surfaces of the side walls of the second trenches 102 to prevent the surfaces of the side walls of the second trenches 102 exposed to the outside from being damaged in the subsequent processes. Material of the first spacers 61 may be an insulating material such as silicon nitride or silicon oxide, and the material of the first spacers 61 is not particularly limited herein.

Step S420, etching the substrate 11 positioned at the bottoms of the plurality of second trenches 102 to form third trenches 103, where the third trenches 103 extend along the second direction B and penetrate through the bottom of each of the plurality of second trenches 102.

Still referring to FIG. 9 and FIG. 10, the third trenches 103 may be formed by means of the second trenches 102. For example, isotropic etching may be performed on the bottoms of the second trenches 102 to form the third trenches 103. The third trenches 103 may communicate with the bottom of each of the second trenches 102. That is, the third trenches 103 may hollow out the bottom of each of the support pillars 110 arranged at intervals along the second direction B, and then the third trenches 103 communicate with the bottom of each of the second trenches 102 arranged at intervals along the second direction B. At this moment, each of the support pillars 110 may be supported by an insulating layer between the support pillars 110 to prevent the support pillars 110 from collapsing, thereby improving the product yield. In this process, the formation positions of the third trenches 103 may be defined by each of the second trenches 102, thereby improving the alignment accuracy of the third trenches 103.

It should be noted that, in the process of forming the third trenches 103, the bottoms of the second trenches 102 may be further etched using the mask layer 5 for forming the second trenches 102 as a mask, thereby forming the third trenches 103 penetrating through each of the second trenches 102, to avoid separately forming the mask layer 5 for accommodating the trenches of the bit line structures 2, which may simplify the processes and reduce the fabrication costs.

As shown in FIG. 1, in Step S140, a conductive material is filled in the third trenches to form the bit line structures.

Figure 12:
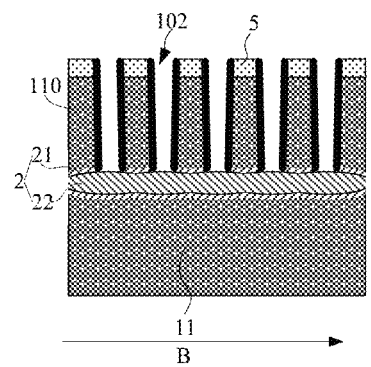
FIG. 12 is a schematic diagram cut along the aa' direction after Step S140 is completed according to an embodiment of the present disclosure.
Figure 13:
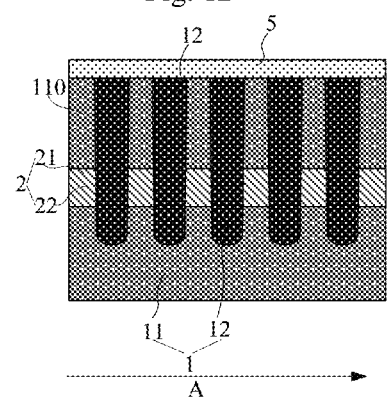
FIG. 13 is a schematic diagram cut along the cc' direction after Step S140 is completed according to an embodiment of the present disclosure.

As shown in FIG. 12 and FIG. 13, the conductive material may be respectively filled in the third trenches 103 by means of vacuum evaporation, magnetron sputtering, chemical vapor deposition, physical vapor deposition, atomic layer deposition or thermal evaporation, etc. Of course, the conductive material may be respectively filled in the third trenches 103 by other means, and then the bit line structures 2 are formed in the third trenches 103.

In some embodiments of the present disclosure, in the process of filling the conductive material, for the convenience of the processes, the conductive material may be deposited on the surface of the mask layer 5 simultaneously, and the deposition is stopped when the conductive material fills up the third trenches 103. The conductive material positioned outside the third trenches 103 may be removed by means of an etching process, and only the conductive material positioned in the third trenches 103 is retained, such that the bit line structures 2 are formed only in the third trenches 103.

In some embodiments of the present disclosure, the bit line structures 2 may be formed in each of the third trenches 103 in one-to-one correspondence. That is, there may be a plurality of bit line structures 2, and number of the bit line structures 2 is equal to number of the third trenches 103. Each of the bit line structures 2 may extend along the second direction B, and the plurality of bit line structures 2 may be arranged at intervals along the first direction A.

In an exemplary embodiment of the present disclosure, filling the conductive material into the third trenches 103 to form the bit line structures 2 (i.e., Step S140) may include Step S510 and Step S520 as below.

Step S510, forming first conductive layers 21 conformally attached to inner walls of the third trenches 103.

The first conductive layers 21 may be formed on the inner walls of the third trenches 103, and thicknesses thereof may range from 1 nm to 9 nm, for example, 1 nm, 2 nm, 4 nm, 6 nm, 8 nm, or 9 nm. Of course, other thicknesses of the first conductive layers 21 may also be acceptable, which are not to be listed herein one by one. For the convenience of the processes, the first conductive layers 21 may also be formed on the surface of the mask layer simultaneously. That is, during the formation of the first conductive layers 21, materials for forming the first conductive layers 21 may be simultaneously deposited on the surface of the mask layer 5. Next, the materials for forming the first conductive layers 21 positioned outside the third trenches 103 may be removed, and only the materials for forming the first conductive layers 21 positioned on the side walls of the third trenches 103 are retained, to ensure that the first conductive layers 21 are only formed on the side walls of the third trenches 103.

In an exemplary embodiment of the present disclosure, the materials of the first conductive layers 21 may be materials with stronger metallicity, and a contact resistance of the bit line structures 2 finally formed may be reduced by means of the materials with stronger metallicity. For example, the material of the first conductive layers 21 may be cobalt silicide.

In an exemplary embodiment of the present disclosure, the forming first conductive layers 21 conformally attached to inner walls of the third trenches 103 (i.e., Step S510) may include Step S5101 and Step S5102 as below.

Step S5101, forming first conductive material layers conformally attached to the inner walls of the third trenches 103.

The first conductive material layers may be formed on the inner walls of the third trenches 103 by means of vacuum evaporation, magnetron sputtering, chemical vapor deposition, physical vapor deposition, atomic layer deposition or thermal evaporation, etc. In this process, for the convenience of the processes, the first conductive material layers may be simultaneously formed on the surface of the mask layer 5. That is, during the formation process of the first conductive material layers, materials for forming the first conductive material layers may be simultaneously deposited the surface of the mask layer 5. Next, the materials for forming the first conductive layers positioned outside the third trenches 103 may be removed, and only the materials for forming the first conductive layers positioned on the side walls of the third trenches 103 are retained, to ensure that the first conductive layers are only formed on the side walls of the third trenches 103.

In some embodiments of the present disclosure, the materials of the first conductive material layers may be materials with stronger metallicity, for example, cobalt, which may be conformally attached to the side walls and bottoms of the third trenches 103.

Step S5102, performing thermal annealing on the first conductive material layers to form the first conductive layers 21.

The first conductive material layers may be thermally annealed to form the first conductive layers 21 conformally attached to the side walls of the third trenches 103. For example, the surface of cobalt may be thermally annealed to form cobalt silicide on the surfaces of the third trenches 103.

Step S520, filling a second conductive material into the third trenches 103 having the first conductive layers 21 to form second conductive layers 22, where the first conductive layers 21 and the second conductive layers 22 jointly constitute the bit line structures 2.

The second conductive material may be filled into the third trenches 103 having the first conductive layers 21 by means of electroplating, vacuum evaporation, magnetron sputtering, chemical vapor deposition, physical vapor deposition, atomic layer deposition or thermal evaporation, etc. Of course, the second conductive material may be filled into the third trenches 103 having the first conductive layers 21 by other means, and then the second conductive layers 22 are formed in each of the third trenches 103 respectively. In some embodiments, the second conductive layers 22 may fill up the third trenches 103, and the first conductive layers 21 and the second conductive layers 22 in the third trenches 103 jointly constitute the bit line structures 2. In the embodiments of the present disclosure, a structure obtained after Step S520 is completed is as shown in FIG. 12 and FIG. 13.

A material of the second conductive layers 22 may be different from that of the first conductive layer 21. For example, the material of the second conductive layers 22 may be tungsten.

As shown in FIG. 1, in Step S150, word line structures are formed in the second trenches, and the word line structures are insulated from the bit line structures.

As shown in FIG. 14 to FIG. 17, the conductive material may be filled in each of the second trenches 102, and then a word line structure 3 may be formed in each of the second trenches 102. The word line structure 3 may be insulated from the bit line structure 2, thereby avoiding occurrence of short circuit or coupling between the word line structure 3 and the bit line structure 2, which can improve the product yield.

In some embodiments of the present disclosure, the word line structure 3 may be formed in each of the second trenches 102 in one-to-one correspondence. That is, there may be a plurality of word line structures 3, and number of the word line structures 3 is equal to number of the second trenches 102. Each of the word line structures 3 may extend along the first direction A, and the plurality of word line structures 3 may be arranged at intervals along the second direction B.

The formation process of the word line structure 3 is described in detail below through two embodiments.

In the first exemplary embodiment of the present disclosure, the word line structure 3 is formed in each of the second trench 102, and the word line structure 3 is insulated from the bit line structure 2 (i.e., Step S150). Step S150 may include Steps S610 to S630 as below.

Step S610, filling an isolation material into the plurality of second trenches 102 having the first spacers 61 to form second spacers 62.

Figure 18:
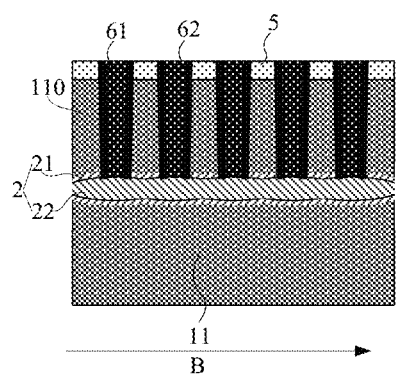
FIG. 18 is a schematic diagram cut along the aa' direction after Step S610 is completed according to the first embodiment of the present disclosure.

As shown in FIG. 18, an isolation material may fill the second trenches 102 having the first spacers 61, and then the second spacers 62 are formed in the second trenches 102. In some embodiments of the present disclosure, the isolation material may cover the surfaces of the bit line structures 2, and the isolation material may fill up the second trenches 102 or may not fill up the second trenches 102, as long as the exposed surfaces of the bit line structures 2 are completely covered.

The isolation material may be an insulating material such as silicon oxide or silicon nitride. It should be noted that materials of the second spacers 62 are different from materials of the first spacers 61, and the surfaces of the bit line structures 2 may be insulated and protected by the first spacers 61 and the second spacers 62. In this process, structural stress may also be balanced by means of cooperation between the first spacers 61 and the second spacers 62.

Step S620, performing selective etching on the first spacers 61 and the second spacers 62, such that surfaces of the first spacers 61 and surfaces of the second spacers 62 are all lower than a surface of the substrate 11, where remaining part of the first spacers 61 and remaining part of the second spacers 62 after the selective etching jointly constitute first insulating layers 6.

Still referring to FIG. 18, in the process of fabrication, to precisely control the thicknesses of the second spacers 62 to achieve a better insulation effect, in the process of filling the isolation material, the isolation material may fill up each of the second trenches 102 (that is, the second spacers 62 may fill up the second trenches 102). Subsequently, the first spacers 61 and the second spacers 62 may be selectively etched, such that the surfaces of the first spacers 61 and the surfaces of the second spacers 62 are all lower than the surface of the substrate 11.

Figure 19:
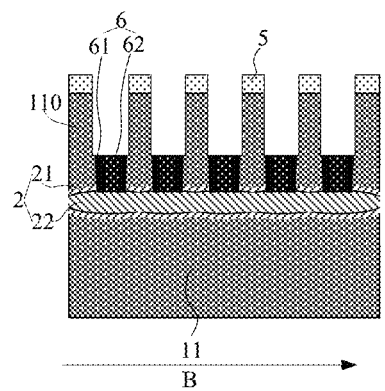
FIG. 19 is a schematic diagram cut along the aa' direction after Step S620 is completed according to the first embodiment of the present disclosure.
Figure 20:
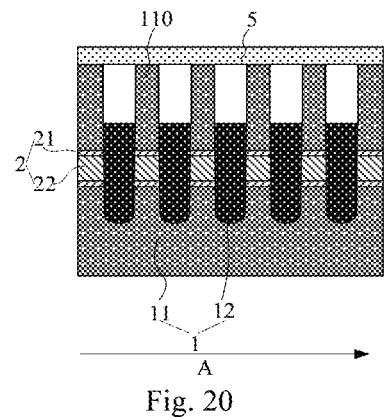
FIG. 20 is a schematic diagram cut along the cc' direction after Step S620 is completed according to the first embodiment of the present disclosure.

As shown in FIG. 19 and FIG. 20, ends of the remaining first spacers 61 distant from the bit line structures 2 after the etching may be flush with ends of the remaining second spacers 62 distant from the bit line structures 2, to provide a flat reference for subsequent formation of the word line structures 3. In the first embodiment of the present disclosure, the remaining first spacers 61 and the remaining second spacers 62 after the selective etching may jointly constitute the first insulating layers 6, and sides of the first insulating layers 6 distant from the bit line structures 2 may expose the side walls of the support pillars 110. That is, the surfaces of the bit line structures 2 may be insulated and protected by means of the first insulating layers 6, thereby reducing possibility of occurrence of coupling or short circuit between the bit line structures 2 and other surrounding structures. For example, providing the first insulating layers 6 may reduce the possibility of occurrence of coupling or short circuit between the bit line structures 2 and the word line structures 3 subsequently formed, such that the product yield may be improved.

Step S630, forming the word line structures 3 on sides of the first insulating layers 6 facing away from the bit line structures 2.

Figure 14:
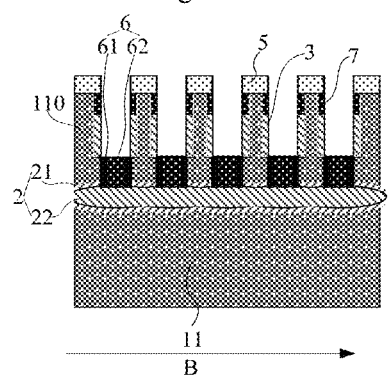
FIG. 14 is a schematic diagram cut along the aa' direction after Step S150 is completed according to a first embodiment of the present disclosure.
Figure 15:
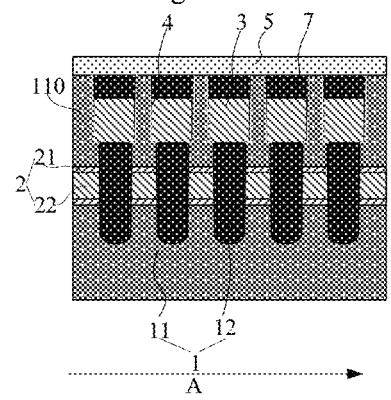
FIG. 15 is a schematic diagram cut along the cc' direction after Step S150 is completed according to the first embodiment of the present disclosure.
Figure 16:
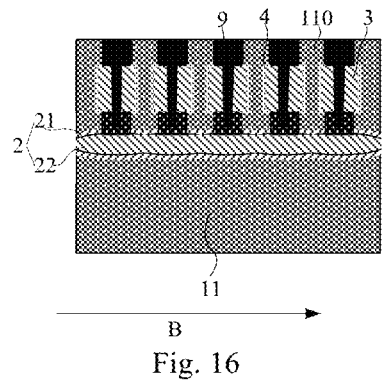
FIG. 16 is a schematic diagram cut along the aa' direction after Step S150 is completed according to a second embodiment of the present disclosure.
Figure 17:
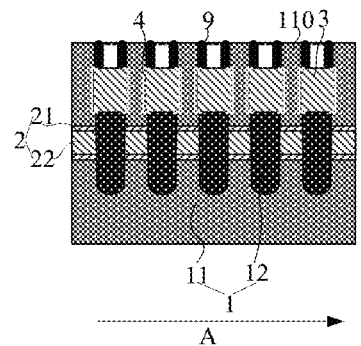
FIG. 17 is a schematic diagram cut along the cc' direction after Step S150 is completed according to the second embodiment of the present disclosure.

As shown in FIG. 14 and FIG. 15, the word line structures 3 may be formed on the surfaces of the first insulating layers 6, and the word line structures 3 may be insulated and isolated from the bit line structure 2 by the first insulating layers 6 to avoid occurrence of coupling or short circuit between the word line structures 3 and the bit line structures 2, thereby improving the product yield.

There may be a plurality of word line structures 3, each of the word line structures 3 may extend along the first direction A, and the plurality of word line structures 3 may be arranged at intervals along the second direction B. For example, the word line structures 3 may be arranged perpendicular to the bit line structures 2.

In an exemplary embodiment of the present disclosure, the method for forming a semiconductor structure provided by the present disclosure may further include:

Step S160, performing lateral etching on side walls of the support pillars 110 positioned on sides of the first insulating layers 6 facing away from the bit line structures 2, to reduce distances from centers to edges of the support pillars 110.

Lateral etching may be performed on the exposed side walls of each of the support pillars 110, such that the side walls of each of the support pillars 110 positioned on sides of the first insulating layers 6 facing away from the bit line structures 2 become thinner, which is helpful to reduce the contact resistance of the word line structures 3 subsequently formed between the support pillars 110.

In some embodiments of the present disclosure, cross sections of the support pillars 110 may be square, circular, elliptic, or irregular shapes, and of course, may also be in other shapes. The shapes of the cross sections of the support pillars 110 are not limited herein. When the cross sections of the support pillars 110 are square, a length of each edge of the square support pillars 110 may be reduced by means of etching or by other means, thereby making the support pillars 110 become thinner. When the cross sections of the support pillars 110 are circular, radiuses of the circular support pillars 110 may be reduced by means of etching or by other means, thereby making the support pillars 110 become thinner.

For example, the side walls of each of the support pillars 110 positioned on the sides of the first insulating layers 6 facing away from the bit line structures 2 may be thermally oxidized to form oxide layers 63 on the surfaces of the support pillars 110, and then the oxide layers 63 may be removed by means of a selective etching process, thereby making the surfaces of the support pillars 110 become thinner. In one embodiment, the support pillars 110 may be made of silicon, and may be silicon pillars. Side walls of the silicon pillars may be thermally oxidized to form silicon oxide, and then the silicon oxide may be removed by means of a wet etching process.

In an exemplary embodiment of the present disclosure, the forming the word line structures 3 on sides of the first insulating layers 6 facing away from the bit line structures 2 (i.e., Step S630) may include Steps S6301 to S6303 as below.

Step S6301, forming inter-gate dielectric layers 4 on the side walls of the support pillars 110, respectively.

Figure 21:
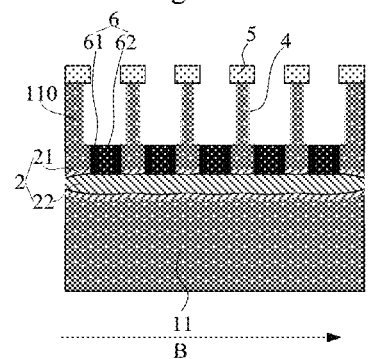
FIG. 21 is a schematic diagram cut along the aa' direction after Step S6301 is completed according to the first embodiment of the present disclosure.
Figure 22:
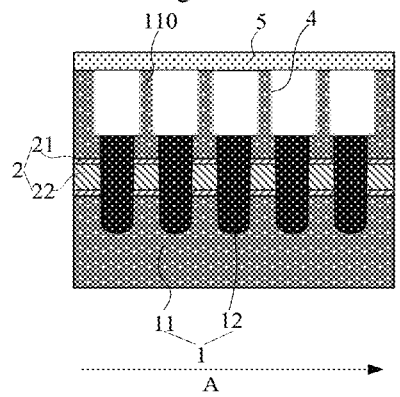
FIG. 22 is a schematic diagram cut along the cc' direction after Step S6301 is completed according to the first embodiment of the present disclosure.

As shown in FIG. 21 and FIG. 22, conformally attached inter-gate dielectric layers 4 may be formed on the side walls of the support pillar 110. Materials of the inter-gate dielectric layers 4 may include silicon oxide, silicon nitride, silicon oxynitride, and so on, or may also be a combination of the aforementioned materials. Thicknesses of the inter-gate dielectric layers 4 may range from 1 nm to 9 nm, for example, 1 nm, 2 nm, 4 nm, 6 nm, 8 nm, or 9 nm. Of course, other thicknesses may also be acceptable, which are not enumerated one by one here.

For example, the conformally attached inter-gate dielectric layer 4 may be formed on the side walls of each of the support pillars 110 by means of chemical vapor deposition, physical vapor deposition, atomic layer deposition, thermal evaporation, or thermal oxidation, etc. Of course, the inter-gate dielectric layers 4 may also be formed in other means, which is not particularly limited here. For the convenience of the processes, in the process of forming the inter-gate dielectric layers 4, the inter-gate dielectric layers 4 may completely cover the top surface of each of the support pillars 110, and then the inter-gate dielectric layers 4 positioned on the top surface of each of the support pillars 110 may be removed, and only the inter-gate dielectric layers 4 positioned on the side walls of each of the support pillars 110 are retained.

In some embodiments of the present disclosure, surfaces of the inter-gate dielectric layers 4 may be treated by means of a thermal oxidation process to improve density of film layers of the inter-gate dielectric layers 4, thereby reducing a leakage current and improving a gate control capability. A barrier effect of the inter-gate dielectric layers 4 on impurities in the substrate 11 may also be enhanced, to prevent the impurities in the substrate 11 from diffusing into the word line structures 3, such that the structural stability may be improved.

Step S6302, depositing a conductive material on a surface of a structure jointly constituted by each of the support pillars 110 having the inter-gate dielectric layers 4 and the first insulating layers 6, to form word line material layers 310, where the word line material layers 310 fill a gap between the support pillars 110.

Figure 23:
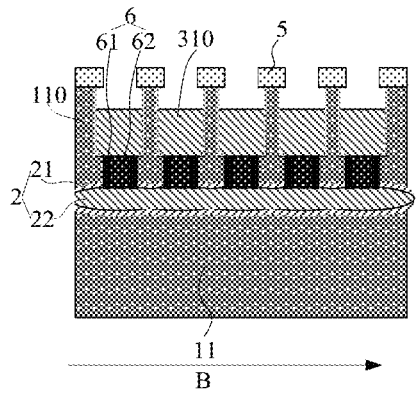
FIG. 23 is a schematic diagram cut along the aa' direction after Step S6302 is completed according to the first embodiment of the present disclosure.
Figure 24:
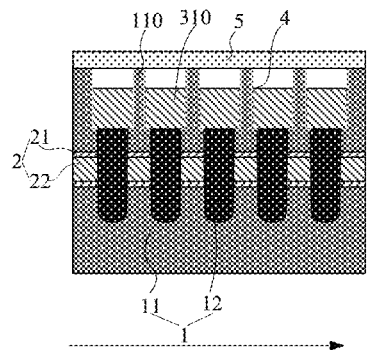
FIG. 24 is a schematic diagram cut along the cc' direction after Step S6302 is completed according to the first embodiment of the present disclosure.

As shown in FIG. 23 and FIG. 24, the word line material layers 310 may be formed on the surfaces of the first insulating layers 6 and may fill the gaps between the supporting pillars 110, and the word line material layers 310 may touch the inter-gate dielectric layers 4 formed on the surfaces of the supporting pillars 110. The conductive material may be tungsten or titanium nitride, and of course, may also be other materials with stronger electrical conductivity, which are not listed one by one herein. Thicknesses of the word line material layers may be 5 nm to 10 nm, for example, 5 nm, 6 nm, 7 nm, 8 nm, 9 nm, or 10 nm. Of course, the word line material layers may also have other thicknesses, which are not listed one by one here.

For example, the word line material layers 310 are formed on the surface of the structure jointly constituted by each of the support pillars 110 having the inter-gate dielectric layers 4 and the first insulating layers 6 by means of chemical vapor deposition, physical vapor deposition, atomic layer deposition, vacuum evaporation, magnetron sputtering or thermal evaporation, etc. Of course, the word line material layers 310 may also be formed in other means, and the formation means of the word line material layers 310 is not particularly limited here.

In some embodiments of the present disclosure, surfaces of the word line material layers 310 facing away from the bit line structures 2 may be lower than the top of each of the support pillars 110, to leave a space for subsequent formation of passivation layers 7 on the surfaces of the word line structures 3.

Step S6303, etching the word line material layers 310 using the first insulating layers 6 as etching stop layers to form a plurality of word line structures 3 extending along the first direction A and arranged at intervals along the second direction B, where orthographic projections of the plurality of word line structures 3 on the substrate 11 wrap the plurality of support pillars 110 inside.

Anisotropic etching may be performed on the word line material layers 310 using the mask layer 5 having the mask patterns as a mask, thereby forming the plurality of word line structures 3 extending along the first direction A and arranged at intervals along the second direction B. In this process, because the distances from centers to edges of the support pillars 110 are reduced in the above process, and the mask layer 5 at the tops of the support pillars 110 is not removed, such that the orthographic projection of the mask layer 5 on the substrate 11 wraps each of the support pillars 110 inside. In the process of etching the word line material layers 310, the first insulating layers 6 may be used as the etching stop layers, and the anisotropic etching is continuously performed on the word line material layers 310 using the mask layer 5 having the mask patterns as a mask to form the plurality of word line structures 3, and the orthographic projection of each of the word line structures 3 on the substrate 11 may wrap the plurality of support pillars 110 inside.

In an exemplary embodiment of the present disclosure, the method for forming a semiconductor structure provided by the present disclosure may further include:

In Step S170, the passivation layers 7 are formed on the surfaces of the word line structures 3.

With continued reference to FIG. 14 and FIG. 15, the passivation layers 7 may be thin films formed on the surfaces of the word line structures 3, or may be coatings formed on the surfaces of the word line structures 3, and the formation means of the passivation layers 7 is not limited here. The passivation layers 7 may cover the surfaces of the word line structures 3. The surfaces of the word line structures 3 may be protected by means of the passivation layers 7, to avoid causing damage to the surfaces of the word line structures 3. The passivation layers 7 may be made of insulating materials such as silicon oxide. The passivation layers 7 may be used as insulating layers to isolate the word line structures 3 from other structures, to avoid the occurrence of coupling or short circuit between the word line structures 3 and the other structures, such that the product yield may be improved.

The passivation layers 7 may be formed on the surfaces of the word line structures 3 by means of chemical vapor deposition, physical vapor deposition, atomic layer deposition, thermal evaporation, vacuum evaporation or magnetron sputtering, etc. Of course, the passivation layers 7 may also be formed in other means, and the formation means of the passivation layers 7 is not limited here.

Figure 25:
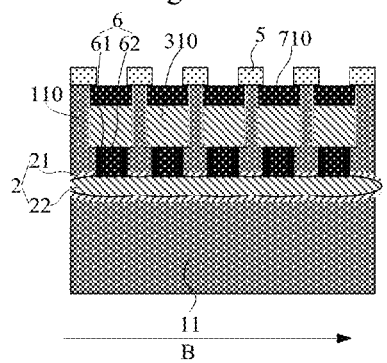
FIG. 25 is a schematic diagram of a passivation material layer cut along the aa' direction according to the first embodiment of the present disclosure.
Figure 26:
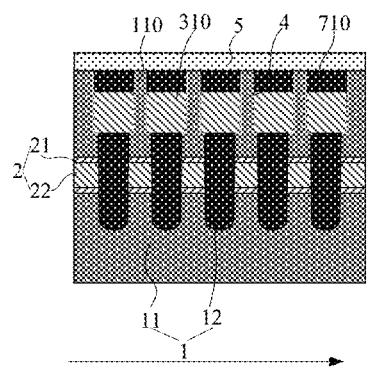
FIG. 26 is a schematic diagram of the passivation material layer cut along the cc' direction according to the first embodiment of the present disclosure.

In an exemplary embodiment of the present disclosure, as shown in FIG. 25 and FIG. 26, before etching the word line material layers 310, passivation material layers 710 may be formed on the surfaces of the word line material layers 310. The passivation material layers 710 may fill up the gaps between the support pillars 110, and upper surfaces of the passivation material layers 710 may be flush with the top of each of the support pillars 110. For example, the passivation material layers 710 may be formed on the surfaces of the word line material layers 310 by means of chemical vapor deposition, physical vapor deposition, atomic layer deposition, thermal evaporation, vacuum evaporation, or magnetron sputtering, etc. Of course, the passivation material layers 710 may also be formed in other means, and the formation means of the passivation material layers 710 is not limited herein.

Figure 27:
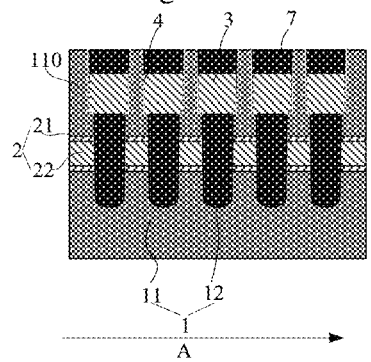
FIG. 27 is a schematic diagram cut along the aa' direction after a mask layer is removed according to the first embodiment of the present disclosure.

In the process of etching the word line material layers 310, the passivation material layers 710 may be etched simultaneously, such that each of the word line structures 3 and the passivation layer 7 on the surface of each of the word line structures 3 may be simultaneously formed by means of the same etching process. It should be noted that, as shown in FIG. 27, after the passivation layers 7 are formed, the mask layer 5 may be removed, such that the surfaces of the passivation layers 7 formed and the top of each of the support pillars 110 are exposed.

In an exemplary embodiment of the present disclosure, the method for forming a semiconductor structure provided by the present disclosure may further include:

Step S180, filling a first insulating material into a structure jointly constituted by the support pillars 110, the word line structures 3, the passivation layers 7 and the first insulating layers 6 to form second insulating layers 8, where the second insulating layers 8 are flush with the surface of each of the support pillars 110.

Figure 28:
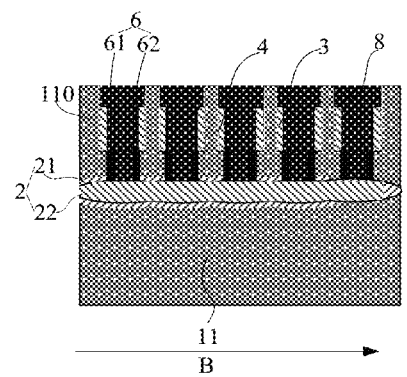
FIG. 28 is a schematic diagram cut along the aa' direction after Step S180 is completed according to the first embodiment of the present disclosure.

As shown in FIG. 28, after the word line structures 3 and the passivation layers 7 are formed, the first insulating material may be filled into the structure jointly constituted by the support pillars 110, the word line structures 3, the passivation layers 7 and the first insulating layers 6 to form the second insulating layers 8, where the second insulating layers 8 may fill up all the gaps in the structure jointly constituted by the support pillars 110, the word line structures 3, the passivation layers 7 and the first insulating layers 6, and upper surfaces of the second insulating layers 8 may be flush with the upper surfaces of the support pillars 110, to provide a flat reference for subsequent manufacturing processes.

The second insulating layers 8 may be made of insulating materials, and the materials of the second insulating layers 8 may be the same as or may be different from the materials of the passivation layers 7, which is not particularly limited herein. In the first embodiment of the present disclosure, the materials of the second insulating layers 8 are the same as the materials of the passivation layers 7. For example, the material of the second insulating layers 8 and the material of the passivation layers 7 are both silicon oxide.

In the second embodiment of the present disclosure, the word line structures 3 are formed in the second trenches 102, and the word line structures 3 are insulated from the bit line structures 2 (i.e., Step S150). Step S150 may include Steps S710 to S770 as below.

Step S710, removing the first spacers 61 to expose side walls of the second trenches 102.

The first spacers 61 may be removed by means of a dry etching process or a wet etching process, such that the side walls of the second trenches 102 are exposed. In this process, an etching gas or etching solution may be set based on the materials of the first spacers 61, and the etching gas or etching solution is not limited herein.

It should be noted that the first spacers 61 in each of the second trenches 102 may be completely removed, such that the side walls of each of the second trenches 102 on the top of each of the bit line structures 2 are entirely exposed.

Step S720, forming oxide layers 63 conformally attached to the side walls and bottoms of the second trenches 102.

Figure 29:
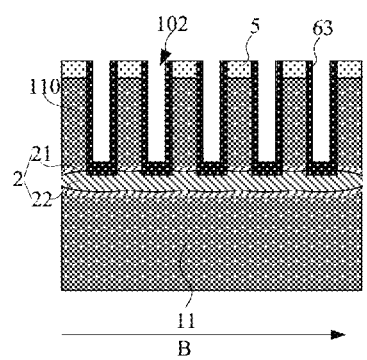
FIG. 29 is a schematic diagram cut along the aa' direction after Step S720 is completed according to the second embodiment of the present disclosure.

As shown in FIG. 29, after the first spacers 61 are removed, the oxide layers 63 conformally attached to the second trenches 102 may be formed in the second trenches 102 by means of vacuum evaporation, magnetron sputtering, chemical vapor deposition, physical vapor deposition, or atomic layer deposition, etc. In some embodiments, the oxide layers 63 may be conformally attached to the side walls and bottoms of the second trenches 102, and the oxide layers 63 formed at the bottoms of the second trenches 102 may cover the surfaces of the bit line structures 2. The surfaces of the side walls of the second trenches 102 may be protected by the oxide layers 63 to prevent from causing damage to the surfaces of the side walls of the second trenches 102 exposed to the outside in the subsequent processes. Furthermore, the bit line structures 2 may be insulated and protected by the oxide layers 63. Materials of the oxide layers 63 may be insulating materials such as silicon oxide. Of course, the materials of the oxide layers 63 may also be other materials, which are listed one by one here.

Step S730, filling a second insulating material into the second trenches 102 having the oxide layers 63 to form insulating dielectric layers 64.

Figure 30:
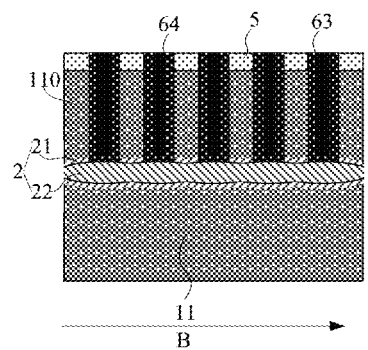
FIG. 30 is a schematic diagram cut along the aa' direction after Step S730 is completed according to the second embodiment of the present disclosure.

As shown in FIG. 30, the second insulating material may fill the second trenches 102 having the oxide layers 63, and then the insulating dielectric layers 64 are formed in the second trenches 102. In some embodiments of the present disclosure, the insulating dielectric layers 64 may fill up the second trenches 102, or may not fill up the second trenches 102, which is not limited herein.

The second insulating material is different from the materials of the oxide layers 63, for example, the second insulating material may be silicon nitride. The surfaces of the bit line structures 2 may be insulated and protected by the oxide layers 63 and the insulating dielectric layers 64 jointly. In this process, the structural stress may also be balanced by means of the coordination between the oxide layers 63 and the insulating dielectric layers 64.

In some embodiments of the present disclosure, after the insulating dielectric layers 64 are formed, the mask layer 5 may be removed, such that the surface of each of the support pillars 110 is exposed. Furthermore, the oxide layers 63 and the insulating dielectric layers 64 higher than the upper surfaces of the support pillars 110 may also be subjected to chemical mechanical polishing, such that ends of the oxide layers 63 and ends of the insulating dielectric layers 64 higher than the upper surfaces of the support pillars 110 are flush with the upper surfaces of the support pillars 110.

Step S740, etching back the oxide layers 63, such that the surfaces of the oxide layers 63 are lower than surfaces of the insulating dielectric layers 64.

Figure 31:
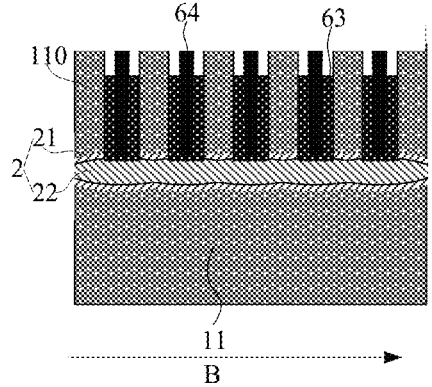
FIG. 31 is a schematic diagram cut along the aa' direction after Step S740 is completed according to the second embodiment of the present disclosure.

During the process of fabrication, to precisely control the thicknesses of the insulating dielectric layers 64 to achieve a better insulating effect. In the process of filling the second insulating material, the second insulating material may fill up each of the second trenches 102 (that is, the insulating dielectric layers 64 may fill up the second trenches 102). Subsequently, as shown in FIG. 31, the oxide layers 63 may be selectively etched, such that tops of the oxide layers 63 are all lower than the upper surfaces of the insulating dielectric layers 64. The surfaces of the bit line structures 2 may be insulated and protected by means of the oxide layers 63 and the insulating dielectric layers 64, thereby reducing the possibility of occurrence of coupling or short circuit between the bit line structures 2 and other surrounding structures, such that the product yield may be improved.

For example, the oxide layers 63 may be etched back by means of a wet etching process. For example, the oxide layers 63 may be chemically cleaned with a dilute hydrofluoric acid (DHF) solution, such that the tops of the oxide layers 63 are lower than the upper surfaces of the insulating dielectric layers 64. For example, the oxide layers 63 may be cleaned with a mixed solution of hydrogen fluoride (HF) with a concentration of 49% and deionized water, where a preparation ratio of HF to the deionized water may be 1:500 to 1:2000, for example, may be 1:500, 1:1000, 1:1500, or 1:2000; of course, other ratios may also be acceptable, which are not be listed herein.

Step S750, filling the second insulating material 9 into the plurality of second trenches 102, where the second insulating material 9 fills up the plurality of second trenches 102.

Figure 32:
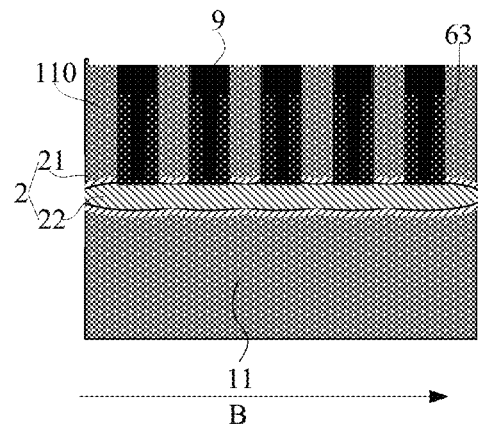
FIG. 32 is a schematic diagram cut along the aa' direction after Step S750 is completed according to the second embodiment of the present disclosure.

As shown in FIG. 32, the second insulating material 9 may fill remaining gaps in the second trenches 102. In this process, the second insulating material 9 may fill up the second trenches 102 (that is, the second trenches 102 may be sealed by means of the second insulating material 9), and may wrap a periphery of each of the support pillars 110 positioned in the second trenches 102 by one lap, to insulate and isolate the support pillars 110 from other structures formed subsequently.

Step S760, removing part of the oxide layers 63 positioned on the side walls of the plurality of second trenches 102 in a direction perpendicular to the substrate 11, and retaining the oxide layers 63 positioned at the bottoms of the plurality of second trenches 102 to form word line trenches 1021.

Figure 33:
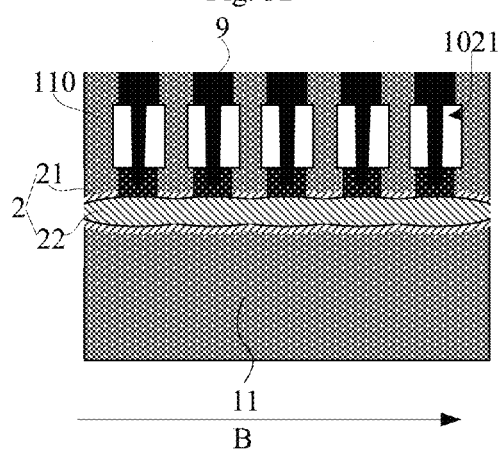
FIG. 33 is a schematic diagram cut along the aa' direction after Step S760 is completed according to the second embodiment of the present disclosure.

As shown in FIG. 33, part of the oxide layer 63 positioned on the side walls of the second trenches 102 may be removed by means of a wet etching process, and then the word line trenches 1021 configured to accommodate the word line structures 3 are formed. For example, the oxide layers 63 positioned on the side walls of the second trenches 102 may be chemically cleaned with a dilute hydrofluoric acid (DHF) solution. For example, the oxide layers 63 may be cleaned with a mixed solution of hydrogen fluoride (HF) with a concentration of 49% and deionized water, where a preparation ratio of HF to the deionized water may be 1:500 to 1:2000, for example, may be 1:500, 1:1000, 1:1500, or 1:2000; of course, other ratios may also be acceptable, which are not be listed herein. During the wet etching process, the oxide layer 63 at the bottoms of the second trenches 102 may be retained. For example, the oxide layers 63 covering the surfaces of the bit line structures 2 may be retained, and the bit line structures 2 may be insulated and isolated from the word line structures 3 subsequently formed in the word line trenches 1021 by remaining oxide layers 63, to avoid the occurrence of short circuit or coupling between the word line structures 3 and the bit line structures 2.

In an exemplary embodiment of the present disclosure, lateral etching may be performed on a part of the side walls of the support pillars 110 exposed in the word line trenches 1021, to reduce the distances from the centers to the edges of the support pillars 110. For example, the lateral etching may be performed on the exposed side walls of each of the support pillars 110, to make a part of the side walls of each of the support pillars 110 exposed in the word line trenches 1021 become thinner, which is helpful for reducing the contact resistance of the word line structures 3 subsequently formed between the support pillars 110.

In some embodiments of the present disclosure, the cross sections of the support pillars 110 may be square, circular, elliptic, or irregular shapes, and of course, may also be in other shapes. The shapes of the cross sections of the support pillars 110 are not limited herein. When the cross sections of the support pillars 110 are square, the length of each edge of the square support pillars 110 may be reduced by means of etching or in other means, thereby making the support pillars 110 become thinner. When the cross sections of the support pillars 110 are circular, the radiuses of the circular support pillars 110 may be reduced by means of etching or in other means, thereby making the support pillars 110 become thinner.

For example, a part of the side walls of each of the support pillars 110 exposed in the word line trenches 1021 may be thermally oxidized to form the oxide layers 63 on the surfaces of the support pillars 110, and then the oxide layers 63 may be removed by means of a selective etching process, thereby making the surfaces of the support pillars 110 become thinner. In one embodiment, the support pillars 110 may be made of silicon, and may be silicon pillars. The side walls of the silicon pillars may be thermally oxidized to form silicon oxide, and then the silicon oxide may be removed by means of a wet etching process.

Step S770, forming the word line structures 3 in the word line trenches 1021.

The word line structures 3 may be formed in the word line trenches 1021, and the word line structures 3 may be insulated and isolated from the bit line structures 2 by means of the oxide layers 63, to avoid the occurrence of coupling or short circuit between the word line structures 3 and the bit line structures 2, thereby improving the product yield. There may be a plurality of word line structures 3, each of the word line structures 3 may extend along the first direction A, and the plurality of word line structures 3 may be arranged at intervals along the second direction B. For example, the word line structures 3 may be arranged perpendicular to the bit line structures 2.

In an exemplary embodiment of the present disclosure, the forming the word line structures 3 in the word line trenches 1021 (i.e., Step S770) may include Steps S7701 to S7702 as below.

Step S7701, forming inter-gate dielectric layers 4 on part of the side walls of the support pillars 110 exposed in the word line trenches 1021.

Conformally attached inter-gate dielectric layers 4 may be formed on the side walls of each of the support pillars 110. Materials of the inter-gate dielectric layers 4 may include silicon oxide, silicon nitride, silicon oxynitride, or other high-k dielectric materials and so on, or may also be a combination of the aforementioned materials. Thicknesses of the inter-gate dielectric layers 4 may range from 1 nm to 9 nm, for example, 1 nm, 2 nm, 4 nm, 6 nm, 8 nm, or 9 nm. Of course, other thicknesses may also be acceptable, which are not enumerated one by one here. For example, the conformally attached inter-gate dielectric layer 4 may be formed on the side walls of each of the support pillars 110 by means of chemical vapor deposition, physical vapor deposition, atomic layer deposition, thermal evaporation, or thermal oxidation, etc. Of course, the inter-gate dielectric layers 4 may also be formed in other means, which is not particularly limited here.

In some embodiments of the present disclosure, surfaces of the inter-gate dielectric layers 4 may be treated by means of a thermal oxidation process to improve density of film layers of the inter-gate dielectric layers 4, thereby reducing a leakage current and improving a gate control capability. A barrier effect of the inter-gate dielectric layers 4 on impurities in the substrate 11 may also be enhanced, to prevent the impurities in the substrate 11 from diffusing into the word line structures 3, such that the structural stability may be improved.

Step S7702, depositing a conductive material in each of the word line trenches 1021 having the inter-gate dielectric layers 4 to form a plurality of word line structures 3 extending along the first direction A and arranged at intervals along the second direction B, where orthographic projections of the plurality of word line structures 3 on the substrate 11 wrap the plurality of support pillars 110 inside.

The conductive material may fill the word line trenches 1021, and may fill up each of the word line trenches 1021; and the conductive material may be in contact with the inter-gate dielectric layers 4 on the surface of each of the support pillars 110. The conductive material may be tungsten or titanium nitride, and of course, may also be other materials with stronger electrical conductivity, which are not listed one by one herein.

For example, the conductive material may be deposited on a surface of a structure jointly constituted by each of the support pillars 110 having the inter-gate dielectric layers 4 and the second trenches 102 by means of chemical vapor deposition, physical vapor deposition, atomic layer deposition, vacuum evaporation, magnetron sputtering or thermal evaporation, etc., and then the word line structures 3 are formed. Of course, the word line structures 3 may also be formed in other means, and the means of forming the word line structures 3 is not particularly limited herein.

In some embodiments of the present disclosure, surfaces of the word line structures 3 facing away from the bit line structures 2 may be lower than the top of each of the support pillars 110, to leave a space for subsequent formation of the passivation layers 7 on the surfaces of the word line structures 3.

In an exemplary embodiment of the present disclosure, the passivation layers 7 may also be formed on the surfaces of the word line structures 3.

Figure 34:
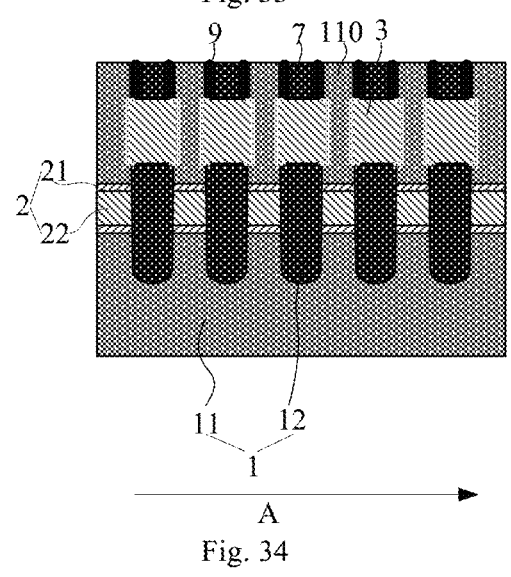
FIG. 34 is a schematic diagram of a passivation layer cut along the aa' direction according to the second embodiment of the present disclosure.

As shown in FIG. 34, the passivation layers 7 may be thin films formed on the surfaces of the word line structures 3, or may be coatings formed on the surfaces of the word line structures 3; and forms of the passivation layers 7 are not limited herein. The passivation layers 7 may fill up all voids in a structure jointly constituted by the support pillars 110 and the word line structures 3, and the upper surfaces of the passivation layers 7 may be flush with the upper surfaces of the support pillars 110, to provide a flat reference for subsequent process of fabrication. The surfaces of the word line structures 3 may be protected by means of the passivation layers 7, to avoid causing damage to the surfaces of the word line structures 3. The passivation layers 7 may be made of an insulating material such as silicon oxide. The passivation layers 7 may be used as insulating layers to isolate the word line structures 3 from other structures, to avoid the occurrence of coupling or short circuit between the word line structures 3 and the other structures, such that the product yield may be improved.

The passivation layers 7 may be formed on the surfaces of the word line structures 33 by means of chemical vapor deposition, physical vapor deposition, atomic layer deposition, thermal evaporation, vacuum evaporation or magnetron sputtering, etc. Of course, the passivation layers 7 may also be formed in other means, and the formation means of the passivation layers 7 is not limited here.

It is to be noted that steps of the method for forming a semiconductor structure in the present disclosure are described in a particular order in the accompanying drawings. However, this does not require or imply to execute these steps necessarily according to the particular order, or this does not mean that the expected result cannot be implemented unless all the shown steps are executed. Additionally, some steps may be omitted, a plurality of steps may be combined into one step for execution, and/or one step may be decomposed into a plurality of steps for execution.

An embodiment of the present disclosure further provides a semiconductor structure, which may be formed by the method for forming a semiconductor structure in any one of the above-mentioned embodiments, and reference may be made to the method for forming a semiconductor structure for details and beneficial effects of the semiconductor structure, which are not repeated here.

An embodiment of the present disclosure further provides a memory, which may include the semiconductor structure in any one of the above embodiments, and its details, formation process and beneficial effects have been described in detail in the corresponding semiconductor structure and the method for forming a semiconductor structure, and thus detailed description of the memory is omitted here.

For example, the memory may be a dynamic random access memory (DRAM), a static random access memory (SRAM) or the like. Of course, the memory may also be other storage apparatuses, which are not to be enumerated one by one here.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the appended claims.

What is claimed is:

1. A method for forming a semiconductor structure, comprising:
    providing a base substrate, the base substrate comprising a substrate and an insulating material layer, the substrate comprising a plurality of first trenches arranged at intervals along a first direction, and the insulating material layer filling each of the plurality of first trenches;
    etching the base substrate to form a plurality of second trenches arranged at intervals along a second direction, the second direction intersecting with the first direction;
    removing a part of a material of the substrate below the plurality of second trenches to form third trenches below the plurality of second trenches, the third trenches penetrating through each of the plurality of second trenches;
    filling a conductive material into the third trenches to form bit line structures; and
    forming word line structures in the plurality of second trenches, the word line structures being insulated from the bit line structures.

2. The method according to claim 1, wherein the providing a base substrate, the base substrate comprising a substrate and an insulating material layer, the substrate comprising a plurality of first trenches arranged at intervals along a first direction, and the insulating material layer filling each of the plurality of first trenches comprises:
    providing a substrate;
    etching the substrate to form a plurality of first trenches arranged at intervals, the plurality of first trenches extending along the second direction, and the plurality of the first trenches being arranged at intervals along the first direction; and
    filling an insulating material into each of the plurality of first trenches to form an insulating material layer.

3. The method according to claim 1, wherein the etching the base substrate to form a plurality of second trenches arranged at intervals along a second direction comprises:
    forming a mask layer on a surface of the base substrate;
    forming a photoresist layer on a surface of the mask layer;
    exposing and developing the photoresist layer to form a plurality of development regions arranged at intervals;
    etching the mask layer in the plurality of development regions to form a plurality of mask patterns arranged at intervals along the second direction, orthographic projections of the plurality of mask patterns on the substrate traversing the plurality of first trenches; and
    performing anisotropic etching on the base substrate using the mask layer having the plurality of mask patterns as a mask, to form a plurality of second trenches extending along the first direction and arranged at intervals along the second direction.

4. The method according to claim 1, wherein the removing a part of a material of the substrate below the plurality of second trenches to form third trenches below the plurality of second trenches, the third trenches penetrating through each of the plurality of second trenches comprises:
    forming first spacers conformally attached to side walls of the plurality of second trenches, and exposing the substrate positioned at bottoms of the plurality of second trenches; and
    etching the substrate positioned at the bottoms of the plurality of second trenches to form third trenches, the third trenches extending along the second direction and penetrating through the bottom of each of the plurality of second trenches.

5. The method according to claim 1, wherein the filling a conductive material into the third trenches to form bit line structures comprises:
    forming first conductive layers conformally attached to inner walls of the third trenches; and
    filling a second conductive material into the third trenches having the first conductive layers to form second conductive layers, the first conductive layers and the second conductive layers jointly constituting the bit line structures.

6. The method according to claim 5, wherein the forming first conductive layers conformally attached to inner walls of the third trenches comprises:
    forming first conductive material layers conformally attached to the inner walls of the third trenches; and
    performing thermal annealing on the first conductive material layers to form the first conductive layers.

7. The method according to claim 5, wherein a material of the first conductive layers is cobalt silicide, and a material of the second conductive layers is tungsten.

8. The method according to claim 4, wherein the forming word line structures in the plurality of second trenches, the word line structures being insulated from the bit line structures comprises:
    filling an isolation material into the plurality of second trenches having the first spacers to form second spacers;
    performing selective etching on the first spacers and the second spacers, such that surfaces of the first spacers and surfaces of the second spacers are all lower than a surface of the substrate, remaining part of the first spacers and remaining part of the second spacers after the selective etching jointly constituting first insulating layers; and
    forming the word line structures on sides of the first insulating layers facing away from the bit line structures.

9. The method according to claim 8, wherein the plurality of first trenches and the plurality of second trenches divide the substrate into a plurality of groups of support pillars arranged at intervals along the first direction, the plurality of groups of support pillars are arranged at intervals along the second direction, and before forming the word line structures in the plurality of second trenches, the formation method further comprises:
    performing lateral etching on side walls of the plurality of groups of support pillars positioned on sides of the first insulating layers facing away from the bit line structures, to reduce distances from centers to edges of the plurality of groups of support pillars.

10. The method according to claim 9, wherein the forming the word line structures on sides of the first insulating layers facing away from the bit line structures comprises:
    forming inter-gate dielectric layers on the side walls of the plurality of groups of support pillars;
    depositing a conductive material on a surface of a structure jointly constituted by each of the plurality of groups of support pillars having the inter-gate dielectric layers and the first insulating layers, to form word line material layers, the word line material layers filling a gap between every adjacent two of the plurality of groups of support pillars; and
    etching the word line material layers using the first insulating layers as etching stop layers to form a plurality of word line structures extending along the first direction and arranged at intervals along the second direction, orthographic projections of the plurality of word line structures on the substrate wrapping the plurality of groups of support pillars inside.

11. The method according to claim 10, further comprising:
forming passivation layers on surfaces of the plurality of word line structures.

12. The method according to claim 11, further comprising:
filling a first insulating material into a structure jointly constituted by the plurality of groups of support pillars, the plurality of word line structures, the passivation layers and the first insulating layers to form second insulating layers, the second insulating layers being flush with a surface of each of the plurality of groups of support pillars.

13. The method according to claim 4, wherein the forming word line structures in the plurality of second trenches, the word line structures being insulated from the bit line structures comprises:
removing the first spacers to expose side walls of the plurality of second trenches;
forming oxide layers conformally attached to the side walls and bottoms of the plurality of second trenches;
filling a second insulating material into the plurality of second trenches having the oxide layers to form insulating dielectric layers;
etching back the oxide layers, such that surfaces of the oxide layers are lower than surfaces of the insulating dielectric layers;
filling the second insulating material into the plurality of second trenches, the second insulating material filling up the plurality of second trenches;
removing part of the oxide layers positioned on the side walls of the plurality of second trenches in a direction perpendicular to the substrate, and retaining the oxide layers positioned at the bottoms of the plurality of second trenches to form word line trenches; and
forming the word line structures in the word line trenches.

14. The method according to claim 13, wherein the plurality of first trenches and the plurality of second trenches divide the substrate into a plurality of groups of support pillars arranged at intervals along the first direction, the plurality of groups of support pillars are arranged at intervals along the second direction, and before forming the word line structures in the word line trenches, the formation method further comprises:
performing lateral etching on part of side walls of the plurality of groups of support pillars exposed in the word line trenches, to reduce distances from centers to edges of the plurality of groups of support pillars.

15. The method according to claim 14, wherein the forming the word line structures in the word line trenches comprises:
forming inter-gate dielectric layers on part of the side walls of the plurality of groups of support pillars exposed in the word line trenches; and
depositing a conductive material in each of the word line trenches having the inter-gate dielectric layers to form a plurality of word line structures extending along the first direction and arranged at intervals along the second direction, orthographic projections of the plurality of word line structures on the substrate wrapping the plurality of groups of support pillars inside.

16. The method according to claim 15, further comprising:
forming passivation layers on surfaces of the plurality of word line structures.

\* \* \* \* \*